United States Patent
Schultz (10) Patent No.: US 10,756,164 B2
(45) Date of Patent: Aug. 25, 2020

(54) SINUSOIDAL SHAPED CAPACITOR ARCHITECTURE IN OXIDE

(71) Applicant: Advanced Micro Devices, Inc., Sunnyvale, CA (US)

(72) Inventor: Richard T. Schultz, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/474,043

(22) Filed: Mar. 30, 2017

(65) Prior Publication Data

US 2018/0286942 A1 Oct. 4, 2018

(51) Int. Cl.
*H01L 21/311* (2006.01)
*H01L 49/02* (2006.01)
(Continued)

(52) U.S. Cl.
CPC .......... *H01L 28/92* (2013.01); *H01L 21/0223* (2013.01); *H01L 21/0273* (2013.01); *H01L 21/31111* (2013.01); *H01L 21/31144* (2013.01); *H01L 21/32051* (2013.01); *H01L 21/32133* (2013.01); *H01L 21/76802* (2013.01); *H01L 21/76877* (2013.01); *H01L 23/5223* (2013.01);
(Continued)

(58) Field of Classification Search
CPC ......... H01L 28/91; H01L 28/92; H01L 21/31; H01L 21/31111; H01L 21/32051; H01L 23/5223; H01L 28/84; H01L 28/87; H01L 28/90

See application file for complete search history.

(56) References Cited

U.S. PATENT DOCUMENTS 6,156,600 A 12/2000 Chao et al.
6,191,479 B1 2/2001 Herrell et al.
(Continued)

FOREIGN PATENT DOCUMENTS

JP 2000138344 A 5/2000

OTHER PUBLICATIONS

Non-Final Office Action in U.S. Appl. No. 15/466,643, dated Aug. 7, 2019, 14 pages.
(Continued)

*Primary Examiner* — Minh Loan Tran
(74) *Attorney, Agent, or Firm* — Kowert Hood Munyon Rankin and Goetzel PC; Rory D. Rankin (57) ABSTRACT

A system and method for fabricating metal insulator metal capacitors while managing semiconductor processing yield and increasing capacitance per area are described. A semiconductor device fabrication process places an oxide layer on top of a metal layer. A photoresist layer is formed on top of the oxide layer and etched with repeating spacing. One of a variety of lithography techniques is used to alter the distance between the spacings. The process etches trenches into areas of the oxide layer unprotected by the photoresist layer and strips the photoresist layer. The top and bottom corners of the trenches are rounded. The process deposits a bottom metal, a dielectric, and a top metal on the oxide layer both on areas with the trenches and on areas without the trenches. The process completes the metal insulator metal capacitor with metal nodes contacting each of the top plate and the bottom plate.

7 Claims, 5 Drawing Sheets

(51) Int. Cl.
*H01L 21/027* (2006.01)
*H01L 21/3205* (2006.01)
*H01L 21/02* (2006.01)
*H01L 21/3213* (2006.01)
*H01L 21/768* (2006.01)
*H01L 23/522* (2006.01)
*H01L 27/07* (2006.01)
*H01L 27/06* (2006.01)
*H01L 27/08* (2006.01)

(52) U.S. Cl.
CPC .............. *H01L 28/40* (2013.01); *H01L 28/82* (2013.01); *H01L 28/84* (2013.01); *H01L 28/90* (2013.01); *H01L 21/02255* (2013.01); *H01L 27/0676* (2013.01); *H01L 27/0716* (2013.01); *H01L 27/0755* (2013.01); *H01L 27/0777* (2013.01); *H01L 27/0788* (2013.01); *H01L 27/0794* (2013.01); *H01L 27/0805* (2013.01)

(56) References Cited

U.S. PATENT DOCUMENTS

| | | |
|---|---|---|
| 6,977,198 B2 | 12/2005 | Gau |
| 7,456,072 B2 | 11/2008 | Olewine et al. |
| 8,178,404 B2 | 5/2012 | Olewine et al. |
| 9,461,131 B1 | 10/2016 | Xiong et al. |
| 9,570,456 B1 | 2/2017 | Jen et al. |
| 2001/0041402 A1 | 11/2001 | Yamamoto |
| 2004/0152259 A1* | 8/2004 | Seo ............... H01L 28/90 438/253 |
| 2005/0035390 A1 | 2/2005 | Beroz |
| 2006/0021570 A1 | 2/2006 | Hasebe et al. |
| 2007/0267705 A1 | 11/2007 | Won et al. |
| 2011/0272702 A1 | 11/2011 | Kwon et al. |
| 2012/0012982 A1 | 1/2012 | Korec et al. |
| 2013/0161792 A1 | 6/2013 | Tran et al. |
| 2013/0334661 A1 | 12/2013 | Nagakura |
| 2014/0104745 A1* | 4/2014 | Zheng ............... H01G 4/33 361/275.1 |
| 2014/0374879 A1 | 12/2014 | Chen et al. |
| 2015/0214150 A1 | 7/2015 | Chang et al. |
| 2015/0295020 A1 | 10/2015 | Tseng et al. |
| 2016/0035818 A1 | 2/2016 | Hoentschel et al. |
| 2016/0043068 A1 | 2/2016 | Ramachandran et al. |
| 2016/0126239 A1* | 5/2016 | Singh ............... H01L 27/0682 257/532 |
| 2016/0218172 A1 | 7/2016 | Hsieh et al. |

OTHER PUBLICATIONS

Final Office Action in U.S. Appl. No. 15/466,643, dated Feb. 28, 2019, 10 pages.

International Search Report and Written Opinion in International Application No. PCT/US2018/025324, dated Jun. 22, 2018, 11 pages.

International Search Report and Written Opinion in International Application No. PCT/US2018/023814, dated Jun. 22, 2018, 12 pages.

Non-Final Office Action in U.S. Appl. No. 15/466,643, dated Jan. 11, 2018, 8 pages.

Schultz, Richard T., U.S. Appl. No. 15/466,643, entitled "Oscillating Capacitor Architecture in Polysilicon for Improved Capacitance", filed Mar. 22, 2017, 34 pages.

Non-Final Office Action in U.S. Appl. No. 15/466,643, dated Aug. 7, 2018, 9 pages.

* cited by examiner

SINUSOIDAL SHAPED CAPACITOR ARCHITECTURE IN OXIDE

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that may limit potential benefits. For example, as the number and size of passive components used in a design increase, the area consumed by these components also increases. Impedance matching circuits, harmonic filters, decoupling capacitors, bypass capacitors and so on are examples of these components.

Many manufacturing processes use metal insulator metal (MIM) capacitors to provide capacitance in both on-die integrated circuits and off-chip integrated passive device (IPD) packages. A MIM capacitor is formed with two parallel metal plates separated by a dielectric layer. Generally speaking, each of the two metal plates and the dielectric layer is parallel to a semiconductor substrate surface. Such MIM capacitors are used in a variety of integrated circuits, including oscillators and phase-shift networks in radio frequency (RF) integrated circuits, as decoupling capacitors to reduce noise in both mixed signal integrated circuits and microprocessors as well as bypass capacitors near active devices in microprocessors to limit the parasitic inductance, and so on. MIM capacitors may also be used as memory cells in a dynamic RAM.

Fabricating MIM capacitors is a challenging process. The material selection for the dielectric layer is limited as many of the materials used for the dielectric layer may diffuse with the metal layers used for the parallel metal plates. This limited selection can also reduce the capacitance per area that might otherwise be achieved. Further, the dielectric layer is typically larger than the gate oxide layer used for active devices such as transistors. Therefore, the MIM capacitors are relatively large, and at times, are larger than the transistors used on the die. When the MIM capacitor sizes are increased to provide the necessary capacitance per area (density), less space is available for other components on the device. In addition, when etching to create space for vias used for connecting the parallel metal plates of a MIM capacitor, more insulating material is etched to reach the bottom metal plate than to reach the top metal plate. Therefore, the chance for etch stop problems increases.

In view of the above, efficient methods and systems for fabricating metal insulator metal capacitors while managing semiconductor processing yield and increasing capacitance per area are desired.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for fabricating metal insulator metal capacitors while managing semiconductor processing yield and increasing capacitance per area are contemplated. In various embodiments, a semiconductor device fabrication process places an oxide layer on top of a metal layer. A photoresist layer is formed on top of the oxide layer and etched with repeating spacing which determines a frequency of an oscillating wave structure to be formed later and used as a metal-insulator-metal (MIM) capacitor. One of a variety of lithography techniques is used to reduce the pitch (increase the frequency) of the trenches.

The process etches trenches into areas of the oxide layer unprotected by the photoresist layer and then strips the photoresist layer. The top and bottom corners of the trenches are rounded to create a basis for the oscillating wave structure. In some embodiments, the process uses relatively high temperature oxidation steps to round the corners. The process deposits a combination of layers including the bottom metal, dielectric and top metal of the MIM capacitor on the oxide layer. The deposition of the combination of layers is performed both on areas with the trenches and on areas without the trenches. The process completes the MIM capacitor with metal nodes contacting each of the top plate and the bottom plate. As the frequency and depth of the trenches increase, the density, such as the capacitance per area, of the MIM capacitor also increases.

Figure 1:
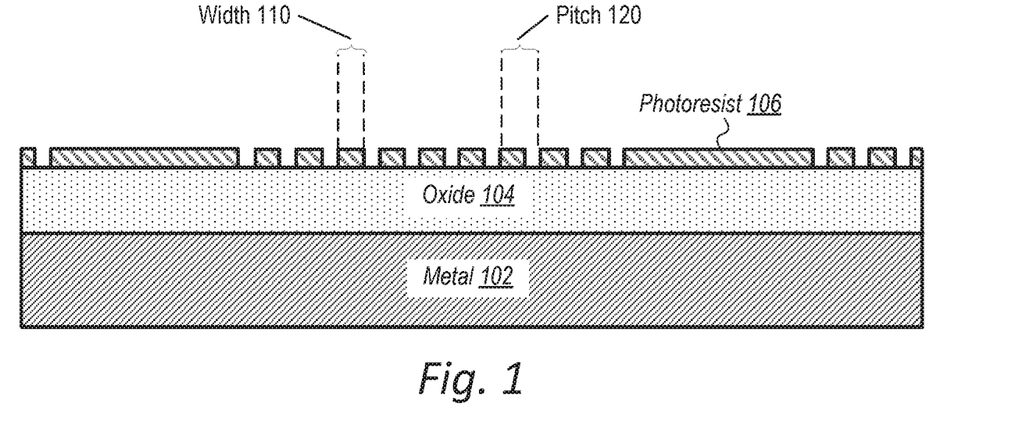
FIG. 1 is a generalized diagram of a cross-sectional view of a portion of a semiconductor passive component being fabricated.

In the description of FIGS. 1-11 that follows, the fabrication steps for a metal insulator metal capacitor with a sinusoidal structure are described. Turning to FIG. 1, a generalized block diagram of a cross-sectional view of a portion of a semiconductor passive component being fabricated is shown. Unlike active components, such as field effect transistors, passive components are not turned on prior to controlling current flow by means of another signal such as a voltage signal. There is no threshold voltage for passive components. Here, a metal layer 102 is deposited on an inter-level dielectric (ILD), which is not shown. In various embodiments, the ILD is used to insulate metal layers which are used for interconnects. In some embodiments, the ILD is silicon dioxide. In other embodiments, the ILD is one of a variety of low-k dielectrics containing carbon or fluorine. The low-k dielectrics provide a lower capacitance between the metal layers, and thus, reduce performance loss, power consumption, and cross talk between interconnect routes. A chemical mechanical planarization (CMP) step is used to remove unwanted ILD and to polish the remaining ILD. The CMP step achieves a near-perfect flat and smooth surface upon which further layers are built.

Deposition of the metal layer 102 follows. In one embodiment, the metal layer 102 is copper. In another embodiment, the metal layer 102 is aluminum or a copper and aluminum mix. In some embodiments, the metal layer 102 is formed by a dual damascene process. In other embodiments the metal layer 102 formed by a single damascene process. These and other techniques are contemplated. In embodiments with copper used as the metal layer 102, a liner using a Ta based barrier material is deposited on the dielectric before the metal layer 102 is formed. The liner prevents the copper from diffusing into the dielectric and acts as an adhesion layer for the copper. Next a thin copper seed layer is deposited by physical vapor diffusion (PVD) followed by electroplating of copper. Next the excess copper metal layer 102 is chemical-mechanical-polished and a capping layer typically SiN (silicon mononitride) is deposited. Afterward, an oxide layer 104 of a controlled thickness is formed. In various embodiments, the oxide layer 104 is silicon dioxide.

In various embodiments, a plasma-enhanced chemical vapor deposition (PECVD) process is used to deposit a thin film of silicon dioxide from a gas state (vapor) to a solid state on the metal layer 102. The PECVD process introduces reactant gases between a grounded electrode and a parallel radio frequency (RF) energized electrode. The capacitive coupling between the electrodes excites the reactant gases into a plasma, which induces a chemical reaction and results in the reaction product being deposited on the metal layer 102.

In some embodiments, the oxide layer 104 is deposited using a combination of gasses such as dichlorosilane or silane with oxygen precursors, such as oxygen and nitrous oxide, typically at pressures from a few millitorr to a few torr. The thickness of the oxide layer 104 is relatively thick. For example, the thickness of the oxide layer 104 is at least an order of magnitude greater than a thickness of a thin gate silicon dioxide layer formed for active devices such as transistors. After the oxide layer 104 is deposited, a photoresist 106 is placed on the oxide layer 104 with a pattern removed for initially defining the non-planar shape of the metal insulator metal (MIM) capacitor.

The spacing of the etchings in the photoresist layer 106 is set by the technique used to remove the photoresist layer 106. In some embodiments, the extreme ultraviolet lithography (EUV) technique is used to provide the resolution of each of the width 110 and the pitch 120. The EUV technique uses an extreme ultraviolet wavelength to reach resolution below 40 nanometers. The extreme ultraviolet wavelength is approximately 13.5 nanometers. Relatively high temperature and high density plasma is used to provide the EUV beam. In other embodiments, the directed self-assembly (DSA) lithography technique used to provide the resolution of each of the width 110 and the pitch 120. The DSA technique takes advantage of the self-assembling properties of materials to reach nanoscale dimensions.

In yet other embodiments, the immersion lithography technique is used to provide the resolution of each of the width 110 and the pitch 120. Immersion lithography uses a liquid medium, such as purified water, between the lens of the imaging equipment and the wafer surface. Previously, the gap space was simply air. The resolution achieved by this technique is the resolution of the imaging equipment increased by the refractive index of the liquid medium. In some examples, the increased resolution falls above 80 nanometers.

In further embodiments, the double patterning technique is used to provide the resolution of each of the width 110 and the pitch 120. The double patterning technique uses immersion optical lithography systems to define features with resolution between 80 and 40 nanometers. Either of the self-aligned doubled patterning (SADP) technique or the litho-etch-litho-etch technique (LELE) is used. The double patterning technique counteracts the effects of diffraction in optical lithography, which occurs when the minimum dimensions of features on a wafer are less than the 193 nanometer wavelength of the illuminating light source. Other examples of techniques used to counteract the effects of diffraction in optical lithography are phase-shift masks, optical-proximity correction (OPC) techniques, optical equipment improvements and computational lithography.

When selecting between immersion lithography, double patterning, EUV and DSA techniques, and other techniques, cost is considered as the cost increases from immersion lithography to EUV. However, over time, the costs of these techniques adjust as well as additional and newer techniques are developed for providing relatively high resolution for the width 110 and the pitch 120. Accordingly, one of a variety of lithography techniques is used to provide relatively high resolution for the width 110 and the pitch 120. As described later, the relatively high resolution for the width 110 and the pitch 120 provides a higher capacitance per area density for a MIM capacitor being fabricated.

Figure 2:
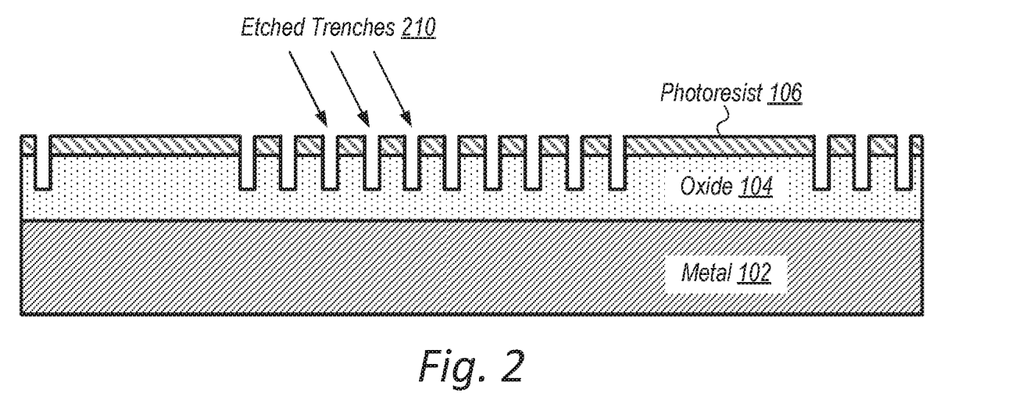
FIG. 2 is a generalized diagram of a cross-sectional view of a portion of a semiconductor passive component being fabricated.

Referring to FIG. 2, a generalized block diagram of another cross-sectional view of a portion of a semiconductor passive component being fabricated is shown. Materials and layers described earlier are numbered identically. As shown, regions of the oxide layer 104 are etched. The etched trenches 210 are placed in regions where the oxide layer 104 is unprotected by the photoresist 106. In some embodiments, a dry etch process is used to provide the etched trenches 210. A reactive-ion etching (RIE) process generates a plasma by an electromagnetic field under a relatively low pressure to remove material. The RIE process is a relatively high anisotropic etch process for creating trenches. Portions of the oxide layer 104 not protected by the photoresist layer 106 are immersed in plasma, which is a reactive gas. The unprotected portions of the oxide layer 104 are removed by chemical reactions and/or ion bombardment. The reaction products are carried away in the gas stream.

Plasma etching processes can operate in one of multiple modes by adjusting the parameters of the etching process. Some plasma etching processes operate with a pressure between 0.1 torr and 5 torr. In various embodiments, the source gas for the plasma contains chlorine or fluorine. For example, trifluoromethane (CHF3) is used to etch silicon dioxide. As shown, the etched trenches 210 have sharp corners. However, in other embodiments, the parameters used for the plasma etching process are adjusted to provide rounded corners for the etched trenches 210. The rounded corners aid in providing conformity in later processing steps where metal and dielectric are deposited on the surfaces of the trenches for building a MIM capacitor. These deposition steps are described shortly.

Figure 3:
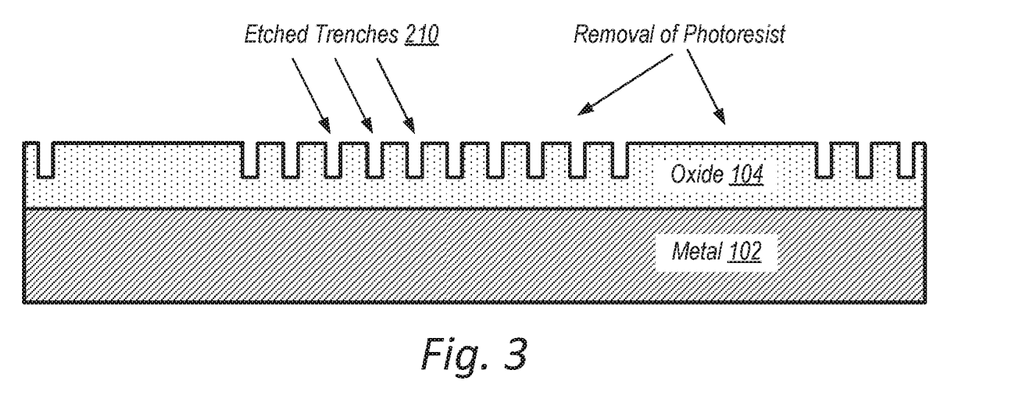
FIG. 3 is a generalized diagram of a cross-sectional view of a portion of a semiconductor passive component being fabricated.
Figure 4:
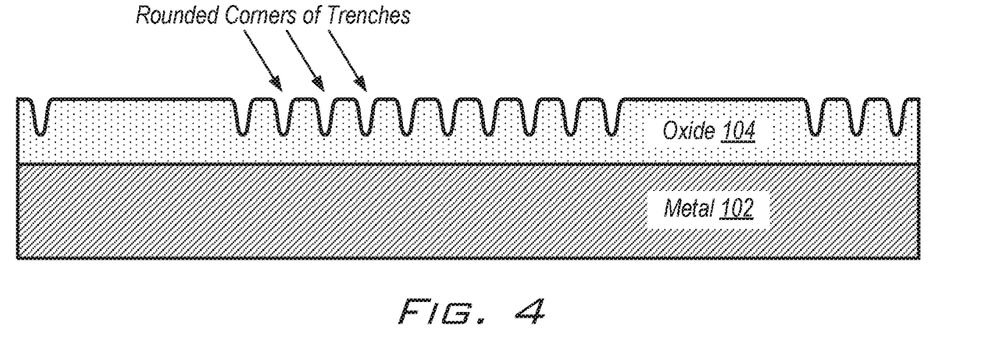
FIG. 4 is a generalized diagram of a cross-sectional view of a portion of a semiconductor passive component being fabricated.

Turning now to FIG. 3, a generalized block diagram of another cross-sectional view of a portion of a semiconductor passive component being fabricated is shown. Here, the photoresist layer 106 is removed. A source gas for plasma containing oxygen is used to oxidize ("ash") photoresist, which facilitates the removal of the photoresist. Referring to FIG. 4, a generalized block diagram of another cross-sectional view of a portion of a semiconductor passive component being fabricated is shown. As shown, the trenches have rounded corners. As described earlier, the rounded corners of the trenches aid in providing conformity in later processing steps where metal and dielectric are deposited on the surfaces of the trenches for building a MIM capacitor. In addition, sharp corners cause a concentration of the electric field for the later-fabricated MIM capacitor, so the rounded corners aid in reducing this effect.

In some embodiments, as described earlier, the rounded corners of the trenches are already created or partially created by adjusting the parameters used for the earlier plasma etching process on the oxide layer 104. In other embodiments, relatively high temperature oxidation is also used. For example, a relatively high temperature oxidation step followed by removal of the oxide with dry etching rounds the corners. In some embodiments, a tetraethyl orthosilicate (TEOS) film is placed along both the top surfaces and the trench surfaces of the oxide layer 104 and then removed.

In yet other embodiments, fluorosilicate glass (FSG), which is fluorine containing silicon dioxide, is formed over the top surfaces and the trench surfaces of the oxide layer 104 with high temperature reflow. A variety of other techniques for rounding the top corners and the bottom corners of the trenches are possible and contemplated.

The rounded trench corners (both top corners and bottom corners) provide a sinusoidal-like waveform in the oxide layer 104. In various embodiments, the waveform is not a symmetrical shape. In some embodiments, the top of the wave has a different width than the bottom of the wave. In other embodiments, the left slope of the wave has a different angle than the right slope of the wave. Although the waveform is not an exact sinusoidal shape, or even symmetrical at times, as used herein, the waveform with the rounded corners is described as being a sinusoidal shape or waveform. The "frequency" of this sinusoidal shape is based on the width 110 and the pitch 120 described earlier in FIG. 1. As described earlier, one of a variety of lithography techniques is used to define the width 110 and the pitch 120 of the trenches such as immersion lithography, double patterning, EUV and DSA techniques, and so on. The sinusoidal waveform is used to create a sinusoidal structure to be used as a MIM capacitor with relatively high density (capacitance per area). It is noted that in other embodiments, the systems and methods described herein can be used to oscillating structures that are not sinusoidal. For example, given a suitable process a saw tooth or square wave structure may be generated. Such alterative embodiments are contemplated as well.

Figure 5:
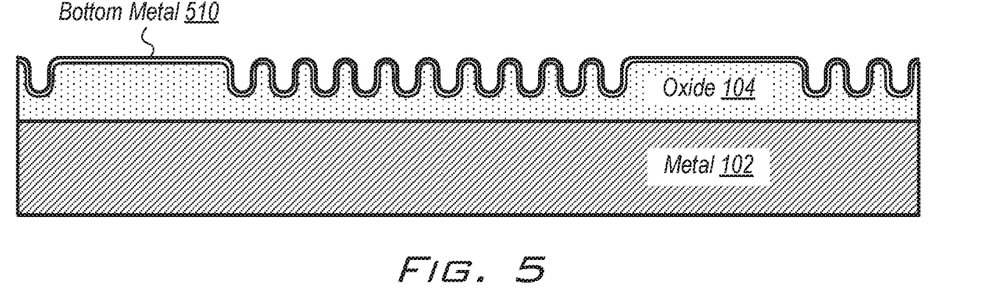
FIG. 5 is a generalized diagram of a cross-sectional view of a portion of a semiconductor passive component being fabricated.
Figure 6:
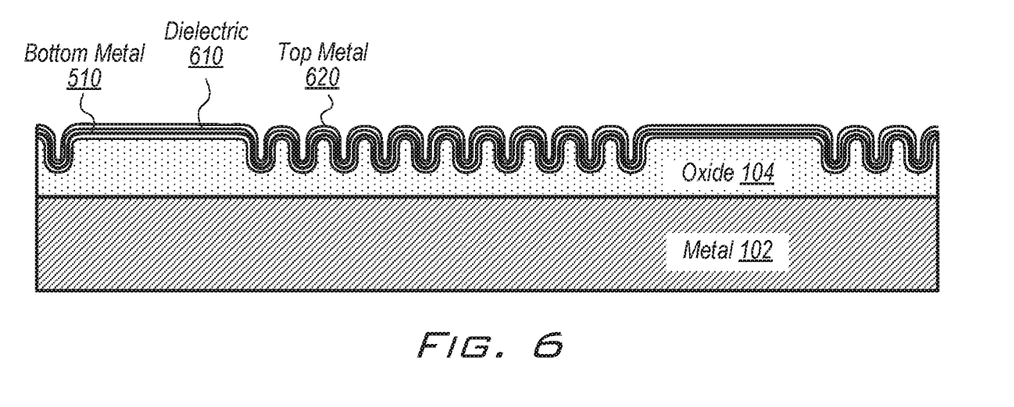
FIG. 6 is a generalized diagram of a cross-sectional view of a portion of a semiconductor passive component being fabricated.

Turning now to FIGS. 5-6, block diagrams of cross-sectional views of a portion of a semiconductor passive component being fabricated are shown. In particular, the metal-insulator-metal layers are deposited for the MIM capacitor. As shown in FIG. 5, the bottom metal is formed for the MIM capacitor. In some embodiments, the bottom metal 510 is tantalum nitride (TaN), whereas in other embodiments, the bottom metal 510 is titanium nitride (TiN). In various embodiments, the bottom metal 510 is placed by atomic layer deposition (ALD). In other embodiments, the bottom metal 510 is placed by physical vapor deposition (PVD) such as a sputter technique.

Following this, as shown in FIG. 6, a relatively high-K oxide dielectric 610 is formed on the bottom metal 510. Examples of the oxide 610 are hafnium oxide (HfO2) and other rare earth metal oxides. In various embodiments, an atomic layer deposition (ALD) is used to place the dielectric 610. The top metal 620 is deposited on the dielectric 610 using a same metal compound and similar technique to deposit the bottom metal 510. The combination of the bottom metal 510, the dielectric 610 and the top metal 620 provides the metal-insulator-metal (MIM) capacitor.

Figure 7:
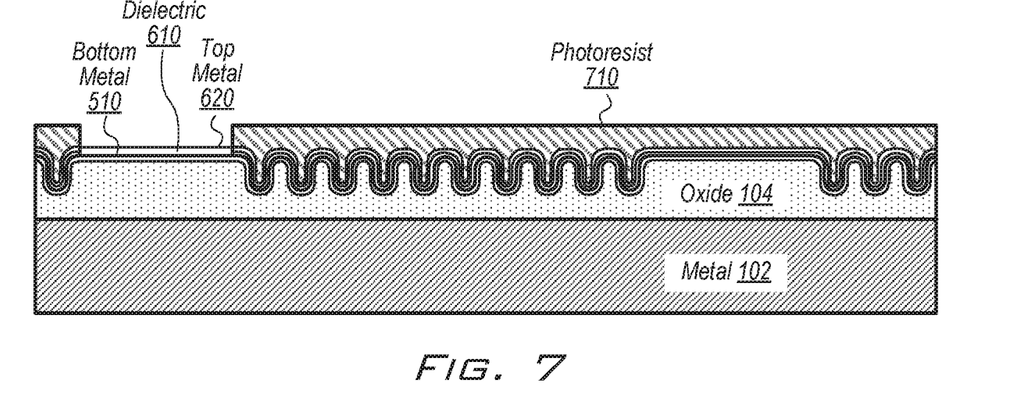
FIG. 7 is a generalized diagram of a cross-sectional view of a portion of a semiconductor passive component being fabricated.
Figure 8:
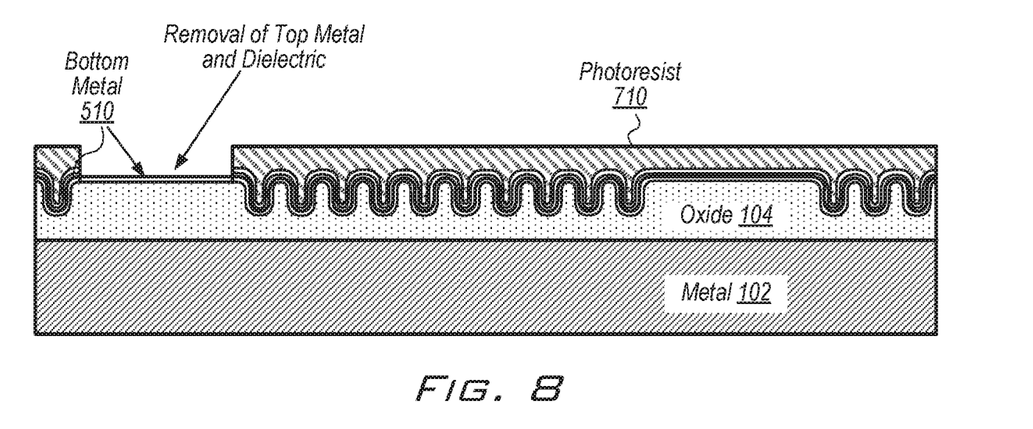
FIG. 8 is a generalized diagram of a cross-sectional view of a portion of a semiconductor passive component being fabricated.
Figure 9:
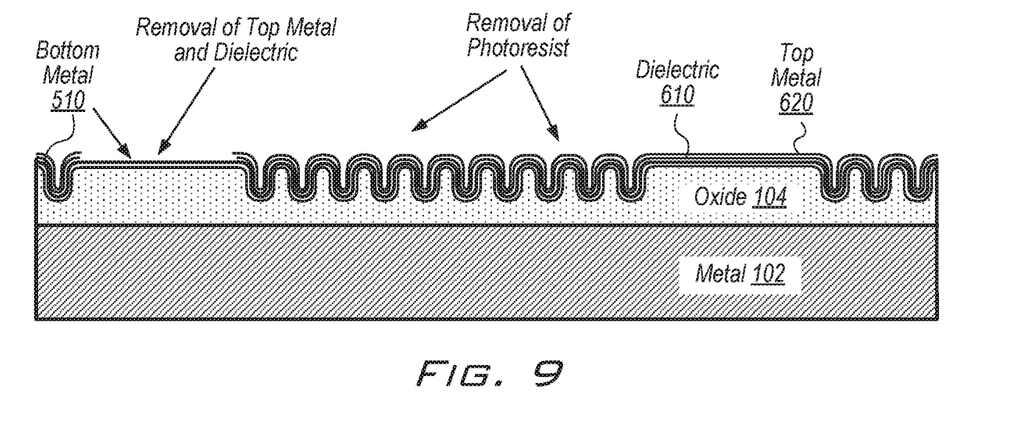
FIG. 9 is a generalized diagram of a cross-sectional view of a portion of a semiconductor passive component being fabricated.

Turning now to FIGS. 7-9, block diagrams of cross-sectional views of a portion of a semiconductor passive component being fabricated are shown. In particular, the top metal 620 and the dielectric 610 are removed in a particular region for later placement of a connecting via. The bottom metal 510 remains in the particular region. FIG. 7 shows a relatively thin, uniform coating of the photoresist layer 710 formed on the top metal 620. As described earlier, UV light is transmitted through a photomask which contains the pattern for the placement of the vias. In these regions, the photoresist layer 710 is removed. Following this, each of the top metal 620 and the dielectric 610 are etched in this region as shown in FIG. 8. In FIG. 9, the photoresist layer 710 is removed. Each of the etching steps for the top metal 620 and the dielectric 610 and the removal of the photoresist layer 710 is done by one of a variety of methods. For example, in some embodiments, at least one of the methods previously described is used.

Figure 10:
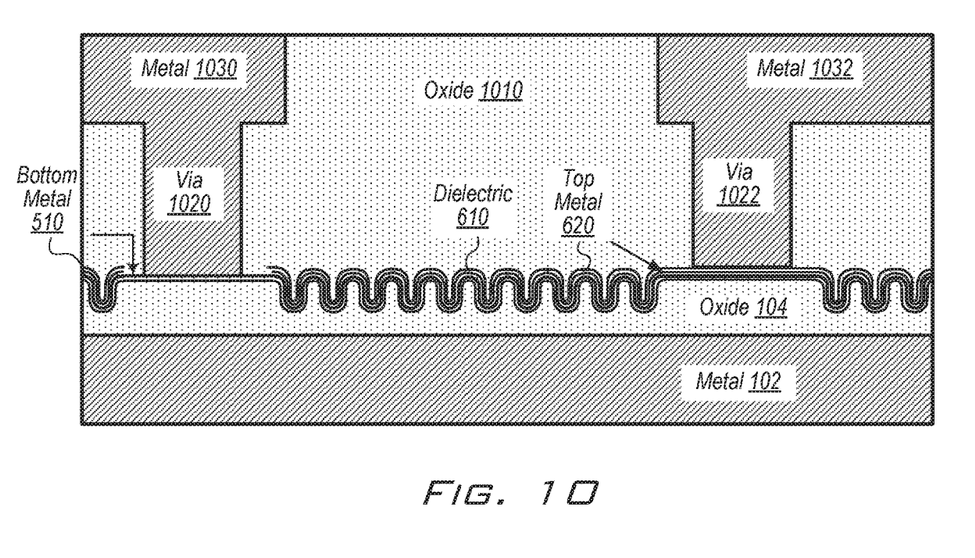
FIG. 10 is a generalized diagram of a cross-sectional view of a fabricated semiconductor metal-insulator-metal (MIM) capacitor with an oscillating pattern.

Referring to FIG. 10, a generalized block diagram of a cross-sectional view of a fabricated semiconductor MIM capacitor with an oscillating pattern is shown. As shown, the oxide layer 1010 is deposited over the oscillating top metal layer 620 and the oscillating bottom metal layer 510 where there is no top metal layer 620. Examples of the oxide layer 1010 are TEOS, silicon dioxide, or one of a variety of low-k dielectrics containing carbon or fluorine. In embodiments with aluminum used for metal layers, each of the vias 1020 and 1022 are formed by etching trenches into the oxide layer 1010, filling the trenches with copper or other conductive metal, and performing a chemical mechanical planarization (CMP) step to polish the surface. Following this, each of the metal 1030 and 1032 is formed on the vias 1020 and 2022. As via 1020 makes contact with the bottom metal layer 510 and the via 1022 makes contact with the top metal layer 620, the MIM capacitor is formed with the metal layers 1030 and 1032 providing the voltage nodes.

In embodiments with copper used for metal layers, a dual damascene process is used. Trenches for the metal layers 1030 and 1032 are etched into the oxide layer 1010, photoresist is placed in the trenches, patterns for the vias 1020 and 1022 are etched, the oxide layer 1010 is etched using these patterns to create space for the vias 1020 and 1022, the photoresist is removed and copper is used to fill the created spaces. Again, as via 1020 makes contact with the bottom metal layer 510 and the via 1022 makes contact with the top metal layer 620, the MIM capacitor is formed with the metal layers 1030 and 1032 providing the voltage nodes.

Figure 11:
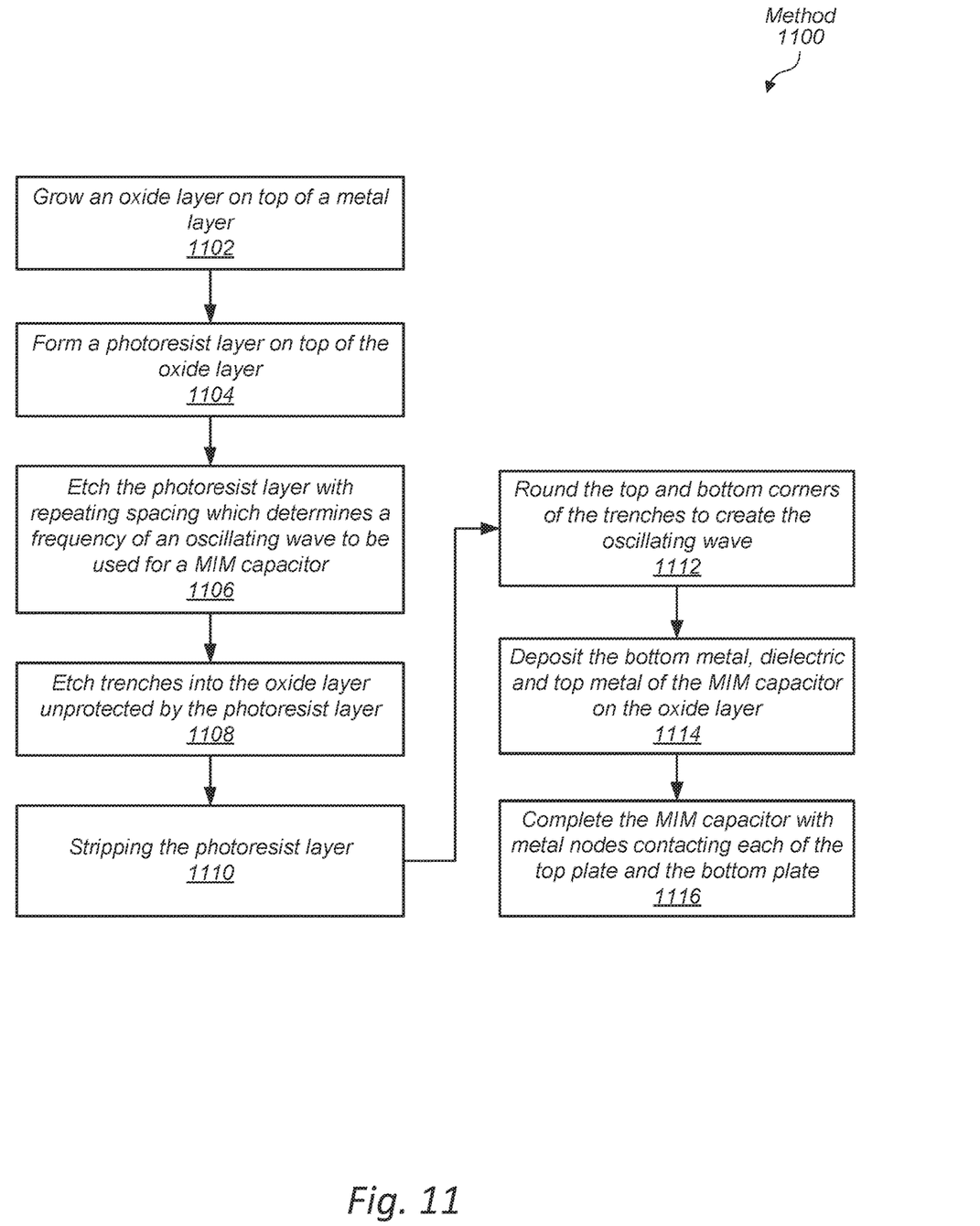
FIG. 11 is a generalized diagram of a method for fabricating a semiconductor metal-insulator-metal (MIM) capacitor with an oscillating pattern.

Turning now to FIG. 11, one embodiment of a method 1100 for fabricating a semiconductor metal-insulator-metal (MIM) capacitor with an oscillating pattern is shown. For purposes of discussion, the steps in this embodiment are shown in sequential order. However, in other embodiments some steps occur in a different order than shown, some steps are performed concurrently, some steps are combined with other steps, and some steps are absent. In the example shown, an oxide layer is grown on top of a metal layer (block 1102). In various embodiments, the oxide layer is silicon dioxide grown on top of copper. In some embodiments, a plasma-enhanced chemical vapor deposition (PECVD) process is used to place the oxide layer on the copper. In other embodiments, the metal layer is a mix of copper and aluminum. A photoresist layer is then formed on top of the oxide layer (block 1104). Subsequently, the photoresist layer is etched (block 1106). The etching occurs with repeating spacing which generally determines a frequency of an oscillating wave to be formed later and used in a MIM capacitor. One of a variety of lithography techniques may be used to reduce or increase the pitch (increase the frequency) of the trenches. For example, one of immersion lithography, double patterning, EUV and DSA techniques, and other techniques, may be used for creating the spacing in the photoresist layer.

Trenches are etched into areas of the oxide layer unprotected by the photoresist layer (block 1108). Following this, the photoresist layer is stripped (block 1110). The top and bottom corners of the trenches are rounded to create a basis for the oscillating wave (block 1112). In some embodiments, relatively high temperature oxidation steps are used to round the corners. The bottom metal, dielectric and top metal of the MIM capacitor are deposited on the oxide layer both on areas with the trenches and on areas without the trenches (block 1114). The MIM capacitor is completed with metal nodes contacting each of the top plate and the bottom plate (block 1116). An insulating oxide is deposited over the MIM capacitor and in some embodiments, a dual damascene process is used for placement of copper metal layers in addition to vias. One via makes contact with the bottom metal and a second via makes contact with the top metal of the MIM capacitor.

It is noted that one or more of the above-described embodiments include software. In such embodiments, the program instructions that implement the methods and/or mechanisms are conveyed or stored on a computer readable medium. For example, program steps describing and controlling fabrication equipment may be stored on a non-transitory computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor device fabrication process comprising:
   forming an oxide layer on top of a first metal layer;
   forming a photoresist layer on top of the oxide layer;
   patterning the photoresist layer;
   etching trenches into the oxide layer unprotected by the photoresist layer, wherein the trenches occur at a plurality of approximately equally spaced locations;
   stripping the photoresist layer;
   depositing a combination of layers comprising a bottom metal layer, a dielectric layer and a top metal layer in the trenches to form a metal-insulator-metal (MIM) capacitor with an oscillating pattern; and
   etching the top metal layer and the dielectric in a first location where there are no trenches.

2. The semiconductor device fabrication process as recited in claim 1, wherein the process further comprises rounding top and bottom corners of the trenches prior to depositing the combination of layers.

3. The semiconductor device fabrication process as recited in claim 2, wherein the rounding comprises adjusting parameters used for a plasma etching process on the oxide layer within the trenches.

4. The semiconductor device fabrication process as recited in claim 2, wherein the rounding comprises relatively high temperature oxidation steps on the oxide layer within the trenches.

5. The semiconductor device fabrication process as recited in claim 1, wherein the process further comprises placing a tetraethyl orthosilicate (TEOS) film along top surfaces of the oxide layer and the trenches and then removed.

6. The semiconductor device fabrication process as recited in claim 1, wherein the process further comprises placing a first via at the first location creating contact with the bottom metal layer.

7. The semiconductor device fabrication process as recited in claim 6, wherein the process further comprises:
- placing a second via at a second location where there are no trenches creating contact with the top metal layer; and
- placing a second metal layer over each of the first via and the second via creating nodes for the MIM capacitor.

* * * * *